United States Patent
Mearns

(10) Patent No.: US 10,488,449 B2
(45) Date of Patent: Nov. 26, 2019

(54) METHOD AND APPARATUS FOR DETERMINING CHARACTERISTICS OF AN INPUT SIGNAL

(71) Applicant: SCHNEIDER ELECTRIC IT CORPORATION, West Kingston, RI (US)

(72) Inventor: Brian Patrick Mearns, Albany, NY (US)

(73) Assignee: SCHNEIDER ELECTRIC IT CORPORATION, West Kingston, RI (US)

( * ) Notice: Subject to any disclaimer, the term of this patent is extended or adjusted under 35 U.S.C. 154(b) by 105 days.

(21) Appl. No.: 14/652,491

(22) PCT Filed: Dec. 20, 2012

(86) PCT No.: PCT/US2012/070867
§ 371 (c)(1),
(2) Date: Jun. 16, 2015

(87) PCT Pub. No.: WO2014/098863
PCT Pub. Date: Jun. 26, 2014

(65) Prior Publication Data
US 2015/0331027 A1    Nov. 19, 2015

(51) Int. Cl.
*G01R 23/10* (2006.01)
*G01R 13/24* (2006.01)

(52) U.S. Cl.
CPC .................. *G01R 23/10* (2013.01)

(58) Field of Classification Search
CPC ....... G01R 23/10; G01R 13/24; G01R 19/255
See application file for complete search history.

(56) References Cited

U.S. PATENT DOCUMENTS

| 4,162,443 A | 7/1979 | Brearley et al. |
| 4,791,589 A * | 12/1988 | Blazo ........................ H04N 5/14 324/76.12 |
| 5,097,490 A | 3/1992 | Hulsing, II et al. |
| 5,243,343 A * | 9/1993 | Moriyasu ................ G01R 13/24 324/102 |

(Continued)

FOREIGN PATENT DOCUMENTS

| DE | 3219283 A1 | 12/1982 |
| DE | 3421728 A1 | 12/1985 |

OTHER PUBLICATIONS

International Search Report from corresponding PCT/US2012/070867 dated Mar. 8, 2013.

(Continued)

*Primary Examiner* — Akm Zakaria
(74) *Attorney, Agent, or Firm* — Lando & Anastasi, LLP

(57) ABSTRACT

Aspects are directed to systems and methods of determining a value of a characteristic related to timing between sequential events of an input electronic signal using an input capture counter having a maximum counting value, the input electronic signal having an expected variable period between events whose value is between a maximum period value and a minimum period value with a delta period value equal to a difference between the maximum period value and the minimum period value.

13 Claims, 4 Drawing Sheets

(56) References Cited

U.S. PATENT DOCUMENTS

| | | | |
|---|---|---|---|
| 6,548,997 B1* | 4/2003 | Bronfer | G04F 10/04 |
| | | | 324/76.48 |
| 2005/0043859 A1 | 2/2005 | Tsai et al. | |
| 2005/0165569 A1* | 7/2005 | Matsui | G01R 29/02 |
| | | | 702/79 |
| 2008/0265680 A1 | 10/2008 | Marwali et al. | |
| 2009/0055031 A1* | 2/2009 | Slota | H02J 3/42 |
| | | | 700/287 |
| 2010/0328849 A1* | 12/2010 | Ewing | G06F 1/266 |
| | | | 361/622 |
| 2013/0154602 A1* | 6/2013 | Courtel | H02M 1/4225 |
| | | | 323/311 |

OTHER PUBLICATIONS

Extended European Search Report from corresponding European Application No. 12890543.7 dated Jul. 28, 2016.

\* cited by examiner

METHOD AND APPARATUS FOR DETERMINING CHARACTERISTICS OF AN INPUT SIGNAL

This application is a U.S. National Stage Application under 35 U.S.C. § 371 from International Application No. PCT/US2012/070867, filed Dec. 20, 2012, which is hereby incorporated by reference in its entirety for all purposes.

FIELD OF THE INVENTION

The present invention relates generally to methods and apparatus for determining characteristics of an input signal. More particularly, at least one embodiment of the invention relates to methods and apparatus for improving resolution of an input capture device.

DISCUSSION OF RELATED ART

Input capture is a technique used to measure the timing difference between two events of an electronic signal, and is commonly used in power systems and other systems for determining the period and/or frequency of a periodic signal. Generally, input capture devices include a counter which is clocked at a constant rate, a register known as a capture register and a mechanism to copy the counter value into the capture register when an event occurs (e.g., a rising edge). The capture devices may also include a current and/or voltage sensor to capture characteristics of the signal. The difference between two capture counter values may be used to determine the period between those events based on the counter's clock rate.

SUMMARY

Aspects and embodiments are directed to methods and apparatus that determine a correct period and/or clock frequency for an input signal.

In one aspect, a method of determining a value of a characteristic related to timing between sequential events of an input electronic signal using an input capture counter having a maximum counting value, the input electronic signal having an expected variable period between events whose value is between a maximum period value and a minimum period value with a delta period value equal to a difference between the maximum period value and the minimum period value is provided. The method includes receiving the electronic signal, setting a counter rate of the input capture counter to a value equal to the maximum counting value divided by the delta period value, detecting a first capture event, determining a value of the input capture counter at the first capture event, detecting a second capture event, determining a value of the input capture counter at the second capture event, and determining the value of the characteristic related to timing based on the value of the input counter at the first capture event and the value of the input counter at the second capture event.

In the method, the characteristic related to timing may be at least one of period, frequency, or elapsed time. In the method, receiving an electronic signal may include receiving input AC power having a voltage waveform, and the value of the characteristic related to timing may be a period of the voltage waveform of the input power. The act of detecting the first capture event may include detecting one of: a rising edge of the electronic signal, a falling edge of the electronic signal, and a threshold value of the electronic signal. The method may further include determining an RMS voltage of the voltage waveform based on voltage samples which are synchronized based on the period of the voltage waveform of the input power. The method may further include detecting that the period of the electronic signal is outside of a range between the maximum period value and the minimum period value. The method may include adjusting, based on detecting that the period of the electronic signal is outside of a range between the maximum period value and the minimum period value, the minimum period value and the maximum period value. The method may include adjusting the counter rate of the input capture counter in response to detecting that the period of the electronic signal is outside of a range between the maximum period value and the minimum period value. The method may also include using a second input capture counter operating at a counter rate less than the counter rate of the input capture counter, detecting an out of range period for the electronic signal based on a counter value from the second input capture counter, and based on detecting the out of range period, adjusting the counter rate of the input capture counter.

In another aspect, a system is provided. The system includes an input configured to receive an input signal with events having an expected variable period between a maximum period value and a minimum period value with a delta period value equal to a difference between the maximum period value and the minimum period value, a capture device coupled to the input and configured to detect at least one characteristic of the input signal, a counter having a counter rate and a maximum counting value, a controller coupled to the capture device and the counter and configured to: set a counter rate of the counter to a value equal to the maximum counting value divided by the delta period value; detect a first capture event based on receiving a signal from the capture device; determine a value of the counter at the first capture event; detect a second capture event based on receiving a signal from the capture device; determine a value of the input counter at the second capture event; and determine the value of the characteristic related to timing based on the value of the input counter at the first capture event and the value of the input counter at the second capture event.

In the system, the characteristic related to timing may be at least one of period, frequency, or elapsed time. The input may be an AC power input of the system and the input periodic signal may be a voltage waveform of input AC power. The capture device may be configured to detect at least one of: a rising edge of the input signal, a falling edge of the input signal, a threshold value of the input signal. The controller may be further configured to determine an RMS voltage of the input voltage waveform based on voltage samples which are synchronized based on the value of the characteristic related to timing. The controller may be further configured to detect that the period of the electronic signal is outside of a range between the maximum period value and the minimum period value. The controller may be further configured to adjust, based on detecting that the period of the electronic signal is outside of a range between the maximum period value and the minimum period value, the minimum period value and the maximum period value. The controller may be further configured to adjust the counter rate of the counter in response to detecting that the period of the electronic signal is outside of a range between the maximum period value and the minimum period value. The system may further include a second counter coupled to the controller and configured to operate at a counter rate less than the counter rate of the counter, and the controller may be further configured to detect an out of range period for the electronic signal based on a counter value from the second counter, and based on detecting the out of range period, adjust the counter rate of the counter.

Yet another aspect is directed to a system that includes an input configured to receive an input signal with events having an expected variable period between a maximum period value and a minimum period value with a delta period value equal to a difference between the maximum period value and the minimum period value, a counter having a counter rate and a maximum counting value, the counter rate being configured to be equal to the maximum counting value divided by the delta period value, and means for detecting a first capture event and a second capture event of the input periodic signal, determining a value of the counter at the first capture event and the second capture event, and determining the value of the characteristic related to timing based on the value of the input counter at the first capture event and the value of the input counter at the second capture event.

The system may further include means for detecting an out of range period of the input signal, and in response adjusting the counter rate of the counter.

Still other aspects, examples, and advantages of these exemplary aspects and examples, are discussed in detail below. Moreover, it is to be understood that both the foregoing information and the following detailed description are merely illustrative examples of various aspects and embodiments, and are intended to provide an overview or framework for understanding the nature and character of the claimed aspects and embodiments. Any example disclosed herein may be combined with any other example in any manner consistent with at least one of the objects, aims, and needs disclosed herein, and references to "an example," "an embodiment," "some examples," "some embodiments," "other examples," "other embodiments," "an alternate example," "an alternate embodiment," "various examples," "various embodiments," "one example," "one embodiment," "at least one example," "at least one embodiment," "this and other examples," "this and other embodiments" or the like are not necessarily mutually exclusive and are intended to indicate that a particular feature, structure, or characteristic described in connection with the example may be included in at least one example. The appearances of such terms herein are not necessarily all referring to the same example.

BRIEF DESCRIPTION OF THE DRAWINGS

The accompanying drawings are not intended to be drawn to scale. In the drawings, each identical or nearly identical component that is illustrated in various figures is represented by a like numeral. For purposes of clarity, not every component may be labeled in every drawing.

In the drawings.

DETAILED DESCRIPTION

Figure 1:
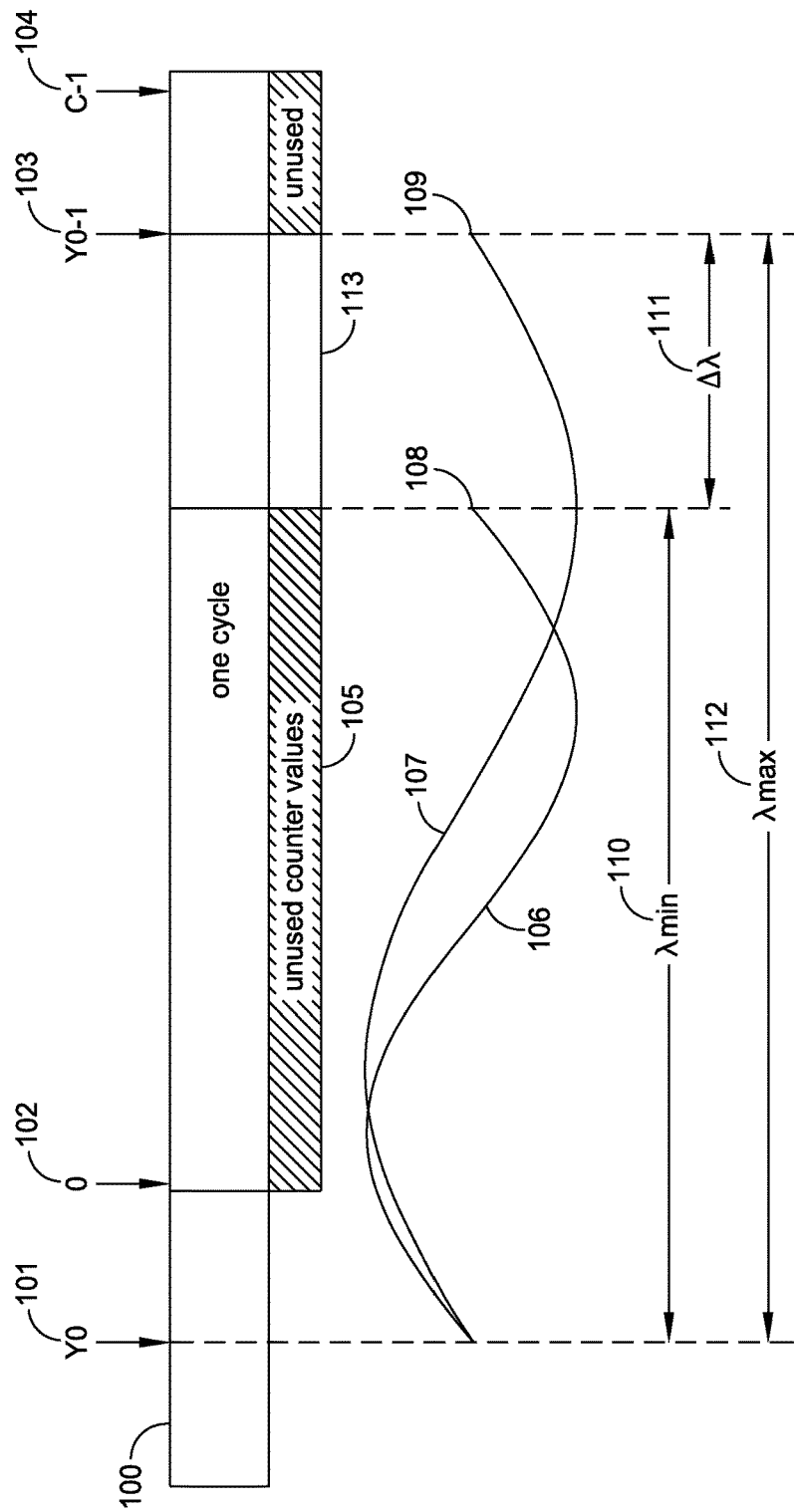
FIG. 1 is a diagram of delta-mode capture of an input signal.

Aspects and embodiments are directed to methods and apparatus to determine the correct clock frequency for an input capture device based on the maximum value of the counter and the upper and lower bounds of the period to be measured, and a method for converting the resulting capture value into a period measurement. The methods and apparatus described herein may be implemented in software, firmware, or hardware logic. The input capture device may be configured to allow the counter to rollover an arbitrary number of times during each period of the input signal, and only requires the counter to be clocked slow enough to prevent the counter from covering its entire range during the elapsed time between the end of the shortest signal period and the end of the longest signal period.

Examples of the methods and apparatuses discussed herein are not limited in application to the details of construction and the arrangement of components set forth in the following description or illustrated in the accompanying drawings. The methods and apparatuses are capable of implementation in other examples and of being practiced or of being carried out in various ways. Examples of specific implementations are provided herein for illustrative purposes only and are not intended to be limiting. In particular, acts, elements and features discussed in connection with any one or more examples are not intended to be excluded from a similar role in any other examples.

Also, the phraseology and terminology used herein is for the purpose of description and should not be regarded as limiting. Any references to examples or elements or acts of the apparatus and methods herein referred to in the singular may also embrace examples including a plurality of these elements, and any references in plural to any example or element or act herein may also embrace examples including only a single element. References in the singular or plural form are not intended to limit the presently disclosed systems or methods, their components, acts, or elements. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. Any references to front and back, left and right, top and bottom, upper and lower, and vertical and horizontal are intended for convenience of description, not to limit the present apparatus and methods or their components to any one positional or spatial orientation.

In devices that utilize input capture techniques discussed above, the precision with which the timing of each event can be measured is a function of the counter frequency. Thus, the faster the counter runs, the more precision the device will have when differentiating periods. In at least some embodiments described herein, devices are able to provide higher resolution, and accordingly, greater precision in period and/or frequency measurements of input signals by maximizing the useful bandwidth of a counter. Techniques described herein may be used in a variety of applications, such as those performing root-mean-squared (RMS) calculations or in devices utilizing phase-locked-loop (PLLs) circuitry.

A traditional approach to input capture measurement is referred to as a "delta-mode" technique in which a difference in time between two captured events is measured. In the delta-mode technique, an initial counter value is automatically copied into "capture" register when the end of the periodic cycle is detected on the input signal (e.g., a rising edge). The counter is then allowed to continue to run free, and it is not reset for each cycle. The difference between two consecutively captured values is used to determine how many times the counter counted during one period, and thus determine the period of the signal. It is acceptable for the counter to "roll over" during this time, however, it is not acceptable for the counter to rollover and then reach the initial value. In other words, the counter must not go through one entire period of its own during one period of the input signal. If this does occur, it is referred to as aliasing, and may result in inaccurate measurements.

Counters are typically configured, based on expected measurement ranges, to have a clock rate slow enough to prevent aliasing. This limiting of clock rates also limits the resolution of measurements in typical devices.

An example of the delta-mode method is illustrated in FIG. 1. The shortest expected input cycle 106, the longest expected input cycle 107, and the counter values 100 over one cycle of the input signal are shown. The beginning of the period may be defined on the input signal waveform as a zero crossing point, a maximum level of the input signal, a minimum level of the input signal or any other point on the waveform. When the input signal begins, the counter has a value of Y0 101. To prevent aliasing in this mode, the counter is set to run slow enough that before the end of the longest input period 109 it will either not rollover, or if it does, it will not count past a value equal to Y0-1 103. Operating in this manner allows the device to determine the input period over a range equal to the time associated with one counter value up to the time associated with the maximum counter value. While this may be useful in some instances, it results in low resolution in the period measurement for situations in which the variability of the period is known and is relatively low. In such situations, the subset of valid counter values may be far less than the maximum counter value. At least some embodiments described herein provide an improved resolution in period measurements in these situations.

Figure 2:
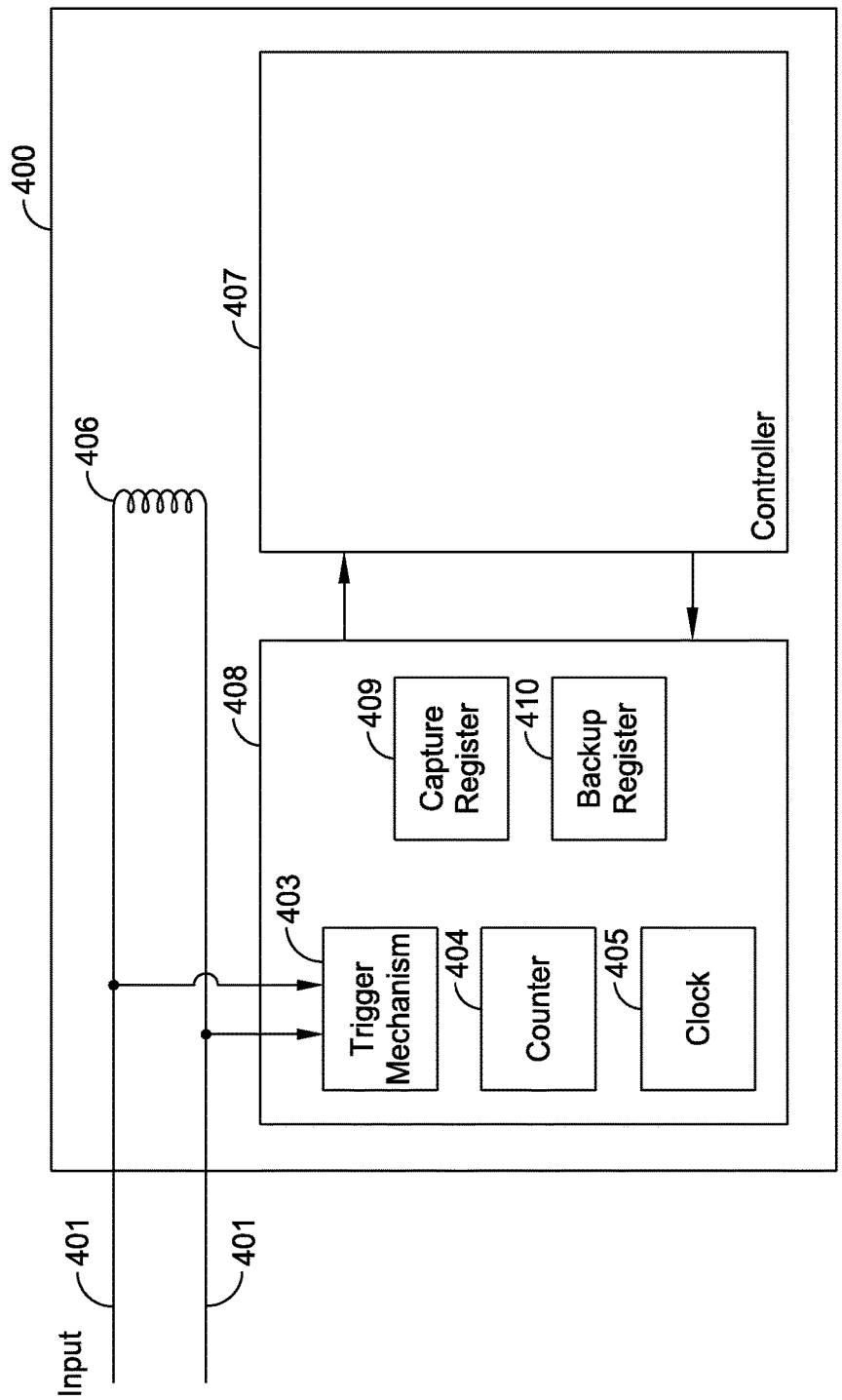
FIG. 2 is a block diagram of a system in accordance with one embodiment.

FIG. 2 is a block diagram of an example power system 400 of some embodiments that uses an improved input capture technique. The power system 400 includes an input 401, a controller 407, a load 406 and an input capture device (ICD) 408. The ICD 408 is comprised of a trigger mechanism 403, a counter 404, a clock 405, a capture register 409 and a backup register 410.

The input is coupled to the load 406. The ICD 408 is coupled to the input 401 and is coupled to the controller 407. Using the circuitry shown, the power system 400 is able to determine the period and/or the frequency of an input power waveform at the input 401 using techniques described further below. Measurements of the period and/or the frequency using the techniques described below may be used by the power system when increased precision is needed to synchronize functions of the system with the input power waveform. For example, these measurements may be used by the power system to synchronize root-mean-squared (RMS) calculations to the input waveform for better accuracy, or as the input to phase-locked loop (PLLs) circuits.

In different embodiments, the power system 400 may be one of many different types of power systems and may use the period and/or frequency measurements to support a number of different functions. In one embodiment, the power system may be a meter configured to use the period and/or frequency information to calculate RMS voltage or current and provide an output of the RMS voltage or current along with a value of frequency or period of an input signal. A display may be optionally coupled to the power system 400 and visually present period and/or frequency information, RMS voltage or current, or any other characteristic calculated from the input signal. In another embodiment, the power system may be an uninterruptible power supply (UPS) that uses the frequency and/or period to determine input RMS voltage, and to synchronize an output voltage waveform with the input waveform. Additionally, the UPS may include a backup power source and provide output power derived from one of an input power source or the backup power source such as a battery. In another embodiment, the input signal 401 may represent detection of certain events, for instance the radioactive decay of an atom, the activation of a traffic sensor, or the activation of any other kind of sensor. In this embodiment, the system 400 could apply the techniques described below to more accurately measure the timing between such events than would otherwise be possible with a counter comparable to the counter 404.

The functional blocks shown in FIG. 2 for the power system 400 may be implemented in various configurations of software, firmware or hardware logic to perform functions described herein. One or more controllers and/or microprocessors may be contained in the power system 400, and the controllers may be embedded in one or more systems, such as, for example, an overall controller of an uninterruptable power supply or one of its components.

Figure 3:
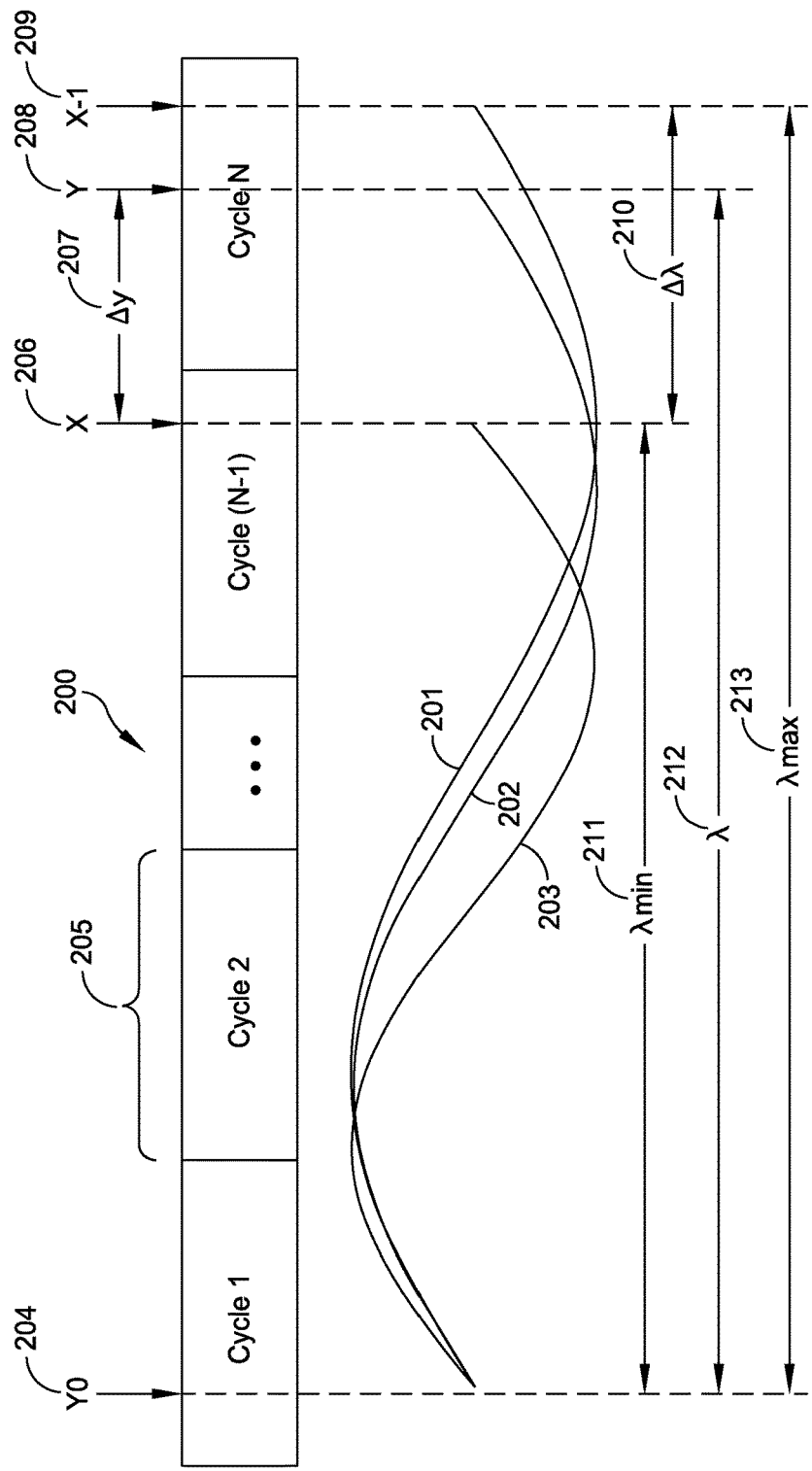
FIG. 3 is a diagram depicting an input capture scheme in accordance with one embodiment.

Operation of the power system 400 to determine period and/or frequency of an input waveform will now be described further with reference to FIGS. 3 and 4. Identical techniques can be applied to determine the timing between consecutive events of any input signal. FIG. 3 shows an input capture timing diagram 200 for the power system 400 for input capture in accordance with some embodiments of the invention disclosed herein. For the example of FIG. 3, the input waveform is specified as having a period ranging from a minimum of $\lambda_{min}$ to a maximum of $\lambda_{max}$.

In the timing diagram 200, three examples of input waveforms are shown, including waveforms 201, 202 and 203. Waveform 201 represents a waveform having the maximum period, waveform 203 represents a waveform having the minimum period, and waveform 202 has a period between the minimum and maximum values. As shown in FIG. 3, in one embodiment of the power system 400, the input counter and clock are configured such that multiple cycles of the counter occur during the period of the input waveform, and to maximize the resolution of measurements, the counter and clock are configured such that the duration of one cycle of the counter is equal to the difference between the specified $\lambda_{min}$ and $\lambda_{max}$.

In FIG. 3, the capture counter value for waveform 203 having the minimum period is shown as X 206 and the capture counter value for the waveform 201 having the maximum period is shown as X-1 209. The difference between $\lambda_{min}$ 211 and $\lambda_{max}$ 213 is denoted in FIG. 3 as $\Delta_\lambda$ 210. The value of the input capture counter 205 is denoted as C in equations provided below. In at least one embodiment, the input capture counter increments over time (i.e, over the course of the input signal cycle) from a value of zero to a maximum value of $C_{max}-1$ before rolling over to zero again.

As discussed above, in at least one embodiment, the counter and clock are configured such that the duration of one cycle of the counter is equal to the difference, $\Delta_\lambda$, between the specified $\lambda_{min}$ and $\lambda_{max}$, and in this embodiment, the maximum counting rate f of the capture counter is determined using Equation (1).

$$f = \frac{C_{max}}{\Delta_\lambda} \qquad \text{Equation (1)}$$

Setting the rate in this manner ensures that the counter will not recycle any values in the duration between the minimum input period 203 and the maximum input period 201, and will maximize the resolution of the input capture device by ensuring that all possible values of the capture counter correspond to possible input signal periods.

An example of calculating the period of an input signal using the optimal capture counter frequency will now be provided using waveform 202 in FIG. 3. The period λ 212 of the waveform 202 is determined as follows. As shown in FIG. 3, the counter has a value of Y0 204 at the start of the period of the waveform 202, and a value of Y 208 at the end of the period. In another embodiment, the beginning and end of the period could be any other pair of events whose timing is to be measured. As previously noted, the capture counter value X 206 corresponds to the minimum periodic cycle 203. The difference between capture counter value X 206 and capture counter value Y 208 is represented as an offset $\Delta_y$ 207. The total number of counts between Y0 204 and X 206 may be calculated using Equation (2).

$$C_A = f \lambda_{min} \qquad \text{Equation (2)}$$

In Equation (2), f is the counting rate and $\lambda_{min}$ 211 is the specified minimum period, which is also the duration between Y0 204 and X 206. The actual value of X 206 is determined using Equation (3).

$$X = (Y0 + f\lambda_{min}) \% \, C_{max} \qquad \text{Equation (3)}$$

In Equation (3), X is equal to the total number of counts, offset from the starting count Y0 then reduced under module $C_{max}$ to account for the rollover of the counter with maximum value $C_{max}-1$. Put another way, X is the value of the counter after a duration of $\lambda_{min}$ has elapsed since the start of the period. Having calculated the capture counter value X, it is then possible to determine the example period of λ utilizing the counter offset $\Delta_y$. FIG. 3 shows that the maximum possible period 213 is equal to X−1 209. Any capture counter value less than X 206 indicates that the capture counter rolled over exactly once during the $\Delta_\lambda$ 210 period. Thus, when capture counter value Y 208 is less than X 206, the offset $\Delta_y$ 207 is equal to $C_{max}+Y-X$. For capture counter values greater than or equal to X 206, $\Delta_y$ 207 is simply Y−X. To avoid special handling involved with signed types, unsigned fixed-width arithmetic with integer types that have the same bit-width as the counter may be implemented. For instance, if the counter is 16-bits wide, then the 16-bit unsigned subtraction Y−X will always give the desired value for $\Delta_y$, even if Y is less than X.

Equation (4) can be used to determine the period T associated with the counter value Y 208.

$$T = \lambda_{min} + \frac{\Delta_y}{f} \qquad \text{Equation (4)}$$

Where $\lambda_{min}$ 211 is the specified minimum period and is associated with the capture counter value X 206, $\Delta_y$ 207 is the number of counts representing the period between X 206 and Y 208 (as previously calculated) and f represents the frequency of the capture counter. With the period determined, the frequency or other characteristics of the input waveform may be determined.

Figure 4:
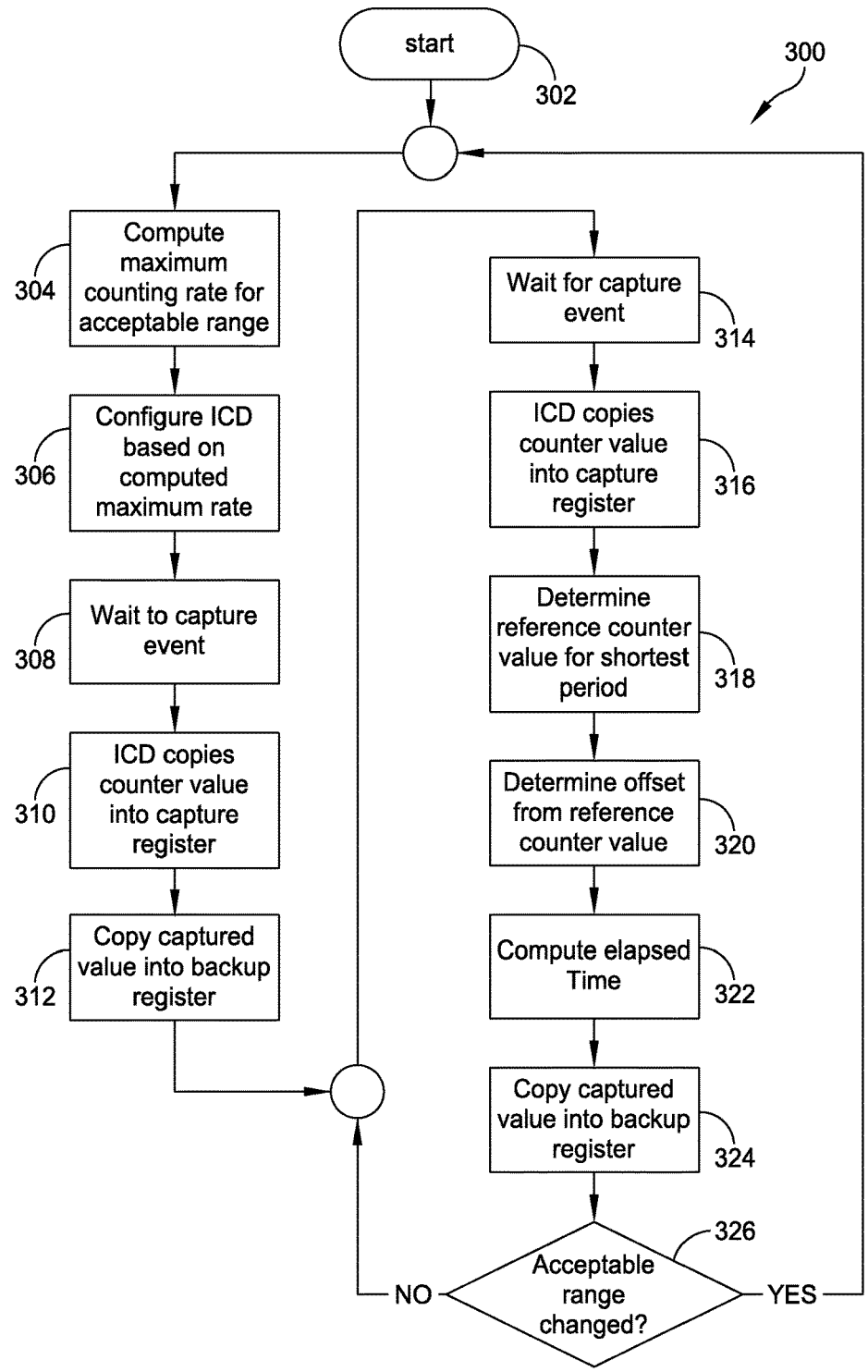
FIG. 4 is a flow chart of a procedure to capture input timing according to one embodiment.

Referring now to FIG. 4, a flowchart of a capture timing method 300 implemented using the power system 400 is depicted. At the start 302 of the method 300, the maximum counting rate for the input capture counter is calculated using Equation (1) described above. The minimum and maximum input periods for an electronic signal may be provided to the power system 400 prior to the start 302 of the method 300, or may be determined by the power system 400 in some embodiments.

If the minimum and maximum input periods for an electronic signal are known prior to the start 302, the maximum counting rate for the input capture counter may be calculated at act 304. The input capture counter frequency is then set at act 306 to the maximum counting frequency, or as close as possible to the maximum counting frequency without exceeding it in the event that the counter only supports specific frequencies. At act 308, the system waits for a capture event (e.g., a rising edge on the input signal), and at act 310 the input capture device captures the counter value into a register in response to this event. At act 312, the system copies the captured counter value from the capture register into a separate backup register, to retain the value when the next event causes a new value to be captured.

After a first capture event completes at act 312, then the system waits at act 314 until a second capture event occurs and copies the capture value into the capture register at act 316. The reference counter value X is calculated at act 318. In some embodiments, a portion of this calculation may occur previously and be stored in the system. The reference counter value X at act 318 is what the counter value would be for the shortest possible period. The reference counter value X at act 318 may be calculated using Equation (3) above, using the previously captured value (subsequently copied into the backup register at act 312) as the value of Y0. At act 320, the delta value from the reference counter value X to the capture value is determined.

Next at act 322 the period of the electronic signal may be calculated based on the captured value of the capture counter at act 316 and the delta value from the reference counter value X from act 320, using Equation (4). At act 324, the value of the capture counter at act 316 may optionally be copied into a register for use in the next cycle if continued measurements are to be performed.

At act 326, it may be optionally determined that the acceptable range for the input period (i.e., the maximum and minimum possible input values) has changed. This may be accomplished in one embodiment by additional capture counters clocked at a frequency significantly slower than the capture counter configured in act 306. If a timer at act 326 is determined to have elapsed before an event is captured at act 314, then a flag may be set indicating that the electronic signal period value is greater than the configured maximum period value. Likewise, if it is determined at act 326 that an event is captured at act 316 before a timer has elapsed, then a flag may be set indicating that the electronic signal period value is less than the configured minimum period value. While act 326 is shown occurring after act 324, in one embodiment, the setting of the flag for a period longer than the maximum, may occur earlier in the method based on the timer elapsing before a capture event at act 314.

As discussed above, at act 326 a second input capture device may be optionally used with a capture counter configured to run at a significantly slower rate than the capture counter configured in act 306, and thus cover a much broader range of possible periods. The second input capture device may detect and flag signals that are out of range, as with the timing technique described herein, and in one embodiment, it can be used to reconfigure the minimum and maximum possible period values.

Alternatively, the system may optionally provide a mechanism by which a user may change the minimum or maximum periods to be considered, instead of having the system determine this automatically as previously described.

At act 326, if the range has not changed, then the method 300 returns to act 314 to repeatedly determine the period and/or frequency of an input waveform.

At act 326, if the range has changed, then the method 300 returns to act 306 where the counter rate is reset. For example, if the second input capture device has an 8-bit counter and is run at 100 Hz, then it will only have a resolution of 10 ms, but in delta-mode can detect signals with periods up to 2.56 seconds. If such a device measured 10 counts during one cycle of the input signal, it would determine that the period of that signal was in the range from 90 ms to 100 ms. The system can then configure the minimum and maximum possible periods used in act 304 to 90 ms and 100 ms, respectively. In this scenario, measurement aliasing is not an issue because it has already been determined that the period is in the newly configured range. If the input capture counter configured in act 306 is an 8-bit counter, it can be clocked at up to 25600 Hz (256 counts/10 ms), giving the capture counter a resolution of about 40 microseconds.

It should be appreciated that at act 326 even more capture counter devices, each having different clock rates, may be used in power system 400 to cover a wider range of possible input periods. Each of the input capture devices can also employ the techniques described herein to improve their resolution over a given range, which would in turn allow the previous input capture devices to be clocked even faster and provide even better resolution.

At least some embodiments discussed herein provide techniques for determining the period and/or frequency of an input waveform in a power system. In other embodiments, the techniques may be used for systems other than power systems, including RF systems and digital timing systems. Further the techniques are not limited for use with an input signal to a system, but may be used with any signals within a system from which an event can be triggered.

At least some embodiments described herein provide techniques for determining characteristics related to the frequency of a periodic waveform. In different embodiments, these characteristics include the period of the waveform, the frequency of the waveform, and the relative phase difference between two waveforms.

Having thus described several aspects of at least one embodiment of this invention, it is to be appreciated that various alterations, modifications and improvements will readily occur to those skilled in the art. Such alterations, modifications, and improvements are intended to be part of this disclosure, and are intended to be within the spirit and scope of the invention. Accordingly, the foregoing description is by way of example only.

What is claimed is:

1. A method of determining a value of a characteristic related to timing between sequential events of an input electronic signal using an input capture counter having a maximum counting value, the method comprising:
   receiving the input electronic signal, the input electronic signal having an expected variable period, which has a value between a maximum period value and a minimum period value;
   determining a delta period value, the delta period value being a value equal to a difference between the maximum period value and the minimum period value;
   determining, based on the delta period value and the maximum counting value, a counter rate;
   setting, based on the determining of the counter rate, an input capture counter rate of the input capture counter to a value equal to the counter rate;
   detecting a first capture event;
   determining a value of the input capture counter at the first capture event;
   detecting a second capture event;
   determining a value of the input capture counter at the second capture event;
   determining the value of the characteristic related to timing of the input electronic signal based on the value of the input capture counter at the first capture event and the value of the input capture counter at the second capture event; and
   adjusting the input capture counter rate of the input capture counter in response to detecting that the characteristic related to timing of the input electronic signal is outside of a range between a maximum value and a minimum value;
   wherein receiving the input electronic signal includes receiving an input AC power having a voltage waveform, and wherein the value of the characteristic related to timing is one of a period and a frequency of the voltage waveform of the input AC power.

2. The method of claim 1, wherein detecting the first capture event includes detecting one of:
   a rising edge of the input electronic signal,
   a falling edge of the input electronic signal, and
   a threshold value of the input electronic signal.

3. The method of claim 1, further comprising determining an RMS voltage of the voltage waveform based on voltage samples which are synchronized based on the period of the voltage waveform of the input AC power.

4. The method according to claim 1, wherein adjusting the input capture counter rate of the input capture counter further includes adjusting the input capture counter rate of the input capture counter in response to detecting that the period of the input electronic signal is outside of a range between the maximum period value and the minimum period value.

5. The method of claim 1, further comprising:
   using a second input capture counter operating at a counter rate less than the counter rate of the input capture counter;
   detecting an out of range period for the input electronic signal based on a counter value from the second input capture counter; and
   based on detecting the out of range period, adjusting the counter rate of the input capture counter.

6. A system for determining a value of a characteristic related to timing comprising:
   an AC input configured to receive an input AC power having a voltage waveform having an expected variable period between a maximum period value and a minimum period value;
   a capture device coupled to the AC input and configured to detect a characteristic related to timing of the input AC power;
   a counter having a maximum counting value; and
   a controller coupled to the capture device and the counter and configured to:
      determine a delta period value, the delta period value being a value equal to a difference between the maximum period value and the minimum period value;
      determine, based on the delta period value and the maximum counting value, a counter rate;

set, based on the determining of the counter rate, an input capture counter rate of the counter to a value equal to the counter rate;

detect a first capture event based on receiving a signal from the capture device;

determine a value of the counter at the first capture event;

detect a second capture event based on receiving a signal from the capture device;

determine a value of the counter at the second capture event;

determine the value of the characteristic related to timing based on the value of the counter at the first capture event and the value of the counter at the second capture event; and adjust the counter rate of the counter in response to detecting that the characteristic related to timing of the voltage waveform is outside of a range between a maximum value and a minimum value.

7. The system of claim 6, wherein the characteristic related to timing is at least one of period, frequency, or elapsed time.

8. The system of claim 6, wherein the capture device is configured to detect at least one of:
a rising edge of the voltage waveform,
a falling edge of the voltage waveform, and
a threshold value of the voltage waveform.

9. The system of claim 6, wherein the controller is further configured to determine an RMS voltage of the voltage waveform based on voltage samples which are synchronized based on the value of the characteristic related to timing.

10. The system of claim 7, wherein the controller is further configured to adjust the counter rate of the counter in response to detecting that the period of the voltage waveform is outside of a range between the maximum period value and the minimum period value.

11. The system of claim 6, further comprising:
a second counter coupled to the controller and configured to operate at a counter rate less than the counter rate of the counter;
wherein the controller is configured to detect an out of range period for the voltage waveform based on a counter value from the second counter, and based on detecting the out of range period, adjust the counter rate of the counter.

12. A system for determining a value of a characteristic related to timing comprising:
an input configured to receive an input AC signal having a voltage waveform having an expected variable period between a maximum period value and a minimum period value;
a counter having a counter rate and a maximum counting value, wherein the counter rate is determined based on the maximum counting value and a delta period value, the delta period value being equal to a difference between the maximum period value and the minimum period value;
means for detecting a first capture event and a second capture event of the input AC signal, determining a value of the counter at the first capture event and the second capture event, and determining the value of the characteristic related to timing based on the value of the counter at the first capture event and the value of the counter at the second capture event; and
means for detecting an out of range characteristic related to timing of the input AC signal, and, in response, adjusting the counter rate of the counter.

13. The system of claim 12, wherein the out of range characteristic related to timing of the input AC signal includes the period of the input AC signal.

* * * * *